United States Patent
Shirai

Patent Number: 5,998,739
Date of Patent: *Dec. 7, 1999

[54] STEPPED CONFIGURED CIRCUIT BOARD

[75] Inventor: Masaharu Shirai, Kusatsu, Japan

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/554,427

[22] Filed: Nov. 6, 1995

[30] Foreign Application Priority Data

Dec. 27, 1994 [JP] Japan ............................. 6-325145

[51] Int. Cl.$^6$ ................................................. H05K 1/03
[52] U.S. Cl. ........................ 174/256; 361/772; 361/777; 428/209
[58] Field of Search .................................. 174/256, 257; 361/777, 779, 772, 774, 767, 771; 428/209; 438/614

[56] References Cited

U.S. PATENT DOCUMENTS 4,853,277  8/1989  Chant ........................................ 428/209

*Primary Examiner*—Kristine Kincaid
*Assistant Examiner*—Dhiru R Patel
*Attorney, Agent, or Firm*—William N. Hogg

[57] ABSTRACT

Short circuiting in printed circuit boards made by processes in which a continuous metal layer applied by electroless deposition is etched to form the conductor pattern is eliminated by subjecting the board to an oxidation treatment after etching but before removal of the etching agent. A circuit board is thereby formed having an insulating material substrate and a conductor formed thereon.

3 Claims, 1 Drawing Sheet

STEPPED CONFIGURED CIRCUIT BOARD

FIELD OF THE INVENTION

The present invention relates to a circuit board and a fabrication method therefor, and more particularly to a circuit board such as multilayer wiring printed circuit board, in which undesirable effects due to residual catalytic metals, such as palladium, used in the production of the circuit board, are eliminated.

BACKGROUND OF THE INVENTION

The present publication is based on Japanese Application Serial No. 6-325145, filed Dec. 27, 1994, the disclosure of which is incorporated herein by reference.

In fabricating a circuit board, techniques for forming a conductor on the surface of the circuit board are roughly divided into three. The first is a method called the subtractive method. In this method, a metal foil is formed on the surface of an insulating material and then an etching resist corresponding to the circuit is formed on the metal foil. Then the unnecessary part of the metal foil is removed by wet etching, thereby forming the circuit board. The second method involves forming a circuit by etching after forming a conductor on the surface of an insulating material by sputtering. The third is called the additive method. In this method, the surfaces of an insulating material other than those intended to carry the circuit, after treating with palladium, are covered with a plating-resistant resist and then a conductor is deposited on the portion not covered with the plating-resistant resist.

On the other hand, in the formation of multilayer wiring printed circuit boards, the technique used involves treating the surface of an insulating material with palladium, depositing a thin conducting layer on the whole surface of the insulating material by electroless plating and then forming a conductor circuit by etching. In practice, after the above deposit of an electroless plating, electroplating is performed to increase the thickness of the conducting layer. In these processes, palladium acts as a catalyst in electroless plating and is effective for easily forming a conductor layer. However, palladium is extremely difficult to dissolve in a normal etching solution and remains after etching in devices having electroless plated and electroplated conductors.

Recently, electroless gold plating, electroless palladium plating, and the like have been frequently used in the surface treatment of pads for the joining of parts. If palladium remains on the surface of the insulating material, gold or palladium is deposited on unintended portions of the insulating material by catalytic action of the residual palladium, thereby generating a short circuit.

It is an object of the present invention to provide a circuit board capable of preventing a short circuiting attributable to catalytic metals, such as palladium, as well as a fabrication method therefor.

SUMMARY OF THE INVENTION

In accordance with the present invention, it has been determined that, in normal processes for making printed circuit boards in which palladium or other catalytic metal is adsorbed onto the surface of the insulating substrate to promote adhesion of a subsequently applied metal layer, the adsorbed catalytic metal remains on the insulating layer surface even though the metal is removed therefrom by etching. As a result, unwanted metal deposits form in these areas during subsequent metal coating steps, which in turn leads to short circuiting.

In accordance with the present invention, however, this problem can be avoided by subjecting the substrate surface, after etching, to an oxidation treatment. Thus, in accordance with the present invention, oxidation of the substrate causes carbon-containing components in the resin of the substrate surface to be oxidized into $CO_2$. This, in turn, causes the catalytic metal, such as palladium, contained in the adsorbed layer on the substrate surface together with the adsorbed layer to be removed. As a result, generation of short circuits attributable to metal formed at undesirable places in subsequent metal coating operations is prevented.

Thus, the present invention provides a circuit board comprising an insulating material substrate and a conductor circuit thereon extending horizontally along a first major surface of said substrate, said conductor circuit comprising: a conductor layer made of a first metal element, a layer of said insulating material on which a second metal element is adsorbed, and a layer of said insulating material on which said second metal element is not adsorbed, wherein said second metal element is more noble than said conductor layer. In addition, the present invention further provides another circuit board comprising an insulating substrate and a conductor circuit formed thereon extending horizontally along the surface of said substrate, said conductor circuit comprising a conductor layer, a layer of said insulating material on which palladium is adsorbed, and a layer of said insulating material on which palladium is not adsorbed.

Also, according to the present invention, there is provided a method for fabricating a circuit board comprising the steps of providing an adsorbed layer of a first metal element on an insulating material substrate, providing a conductor layer of a second metal element on said adsorbed layer and forming a conductor circuit by etching, and removing said first metal element contained in said adsorbed layer together with part of said insulating material substrate by oxidation treatment of the surface of said insulating material substrate, thereby forming said conductor circuit. In addition, the present invention further provides another method for fabricating a circuit board comprising the steps of providing an adsorbed layer of palladium on an insulating material substrate, providing a conductor layer on said palladium adsorbed layer and forming a conductor circuit by etching, and removing the part of said insulating material substrate containing said palladium adsorbed layer by oxidation treatment of the surface of said insulating material substrate, thereby forming said conductor circuit.

| Number | Element |
| --- | --- |
| 1 | Palladium adsorbed layer |
| 1a | Remaining palladium adsorbed layer |
| 2 | Copper plated layer |
| 3 | Photoresist layer |
| 5 | Stepped parts different in vertical dimension from the corresponding resin layer |
| 10 | Substrate |

DETAILED DESCRIPTION

Figure 1A:
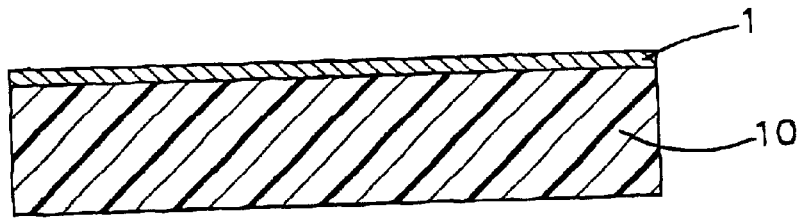
FIGS. 1a through 1e illustrate one embodiment of the inventive method for fabricating a circuit board according to the present invention. In this figure, the following numbers represent the following elements.

Hereinafter, referring to the drawings, the present invention will be described in further detail. FIG. 1 illustrates one embodiment of the inventive method for fabricating a circuit board according to the present invention. FIG. 1(a) shows a substrate 10 having a palladium adsorbed layer 1 formed thereon. As the insulating material constituting substrate 10, not only thermosetting resins, such as, e.g., epoxy resin, phenol resin, polyimide and polyester and thermoplastic resins, such as, e.g., flouroresin, polyethylene, polyether sulfone and polyether imide can be used, but also a composite material composed of a thermosetting or thermoplastic resin and paper or glass unwoven fabrics can also be used.

A substrate 10 formed from one of these insulating materials and having a palladium adsorbed layer 1 thereon is formed by soaking substrate 10 in a palladium chloride solution. In place of a palladium adsorbed layer 1, palladium may be adsorbed on the surface of an insulating material in an interposed state by previously dispersing palladium into the insulating material. This palladium, adsorbed onto a resin, normally exists in the form of a very thin layer on the surface of the resin and functions as a catalyst in electroless plating.

Figure 1B:
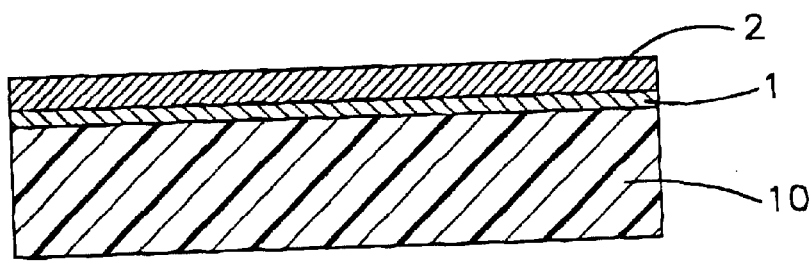

As shown in FIG. 1(b), a copper plated conductor layer 2 is formed on palladium adsorbed layer 1 by electroless plating. As this conductor layer, a conductor layer obtained by electroplating an electroless plated surface, as desired, may be used.

Figure 1C:
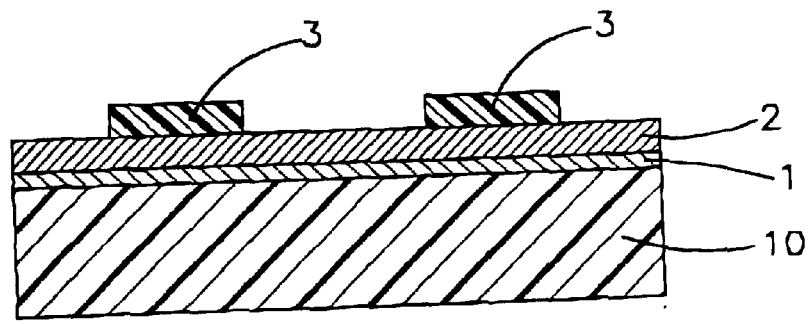

Next, as shown in FIG. 1(c), a photoresist layer 3 is formed on conductor layer 2, and thereafter unnecessary portions of the copper plated layer 2 are dissolved and removed by using an etching solution to form a circuit. In this process, photosensitive dry films, photosensitive liquid resists, photosensitive electrodeposition resists, nonphotosensitive screen printing resists and the like, for example, can be used as the resist. Also cupric chloride, ferric chloride, a mixed solution of sulfuric acid and hydrogen peroxide and the like can be sued as the etching solution.

Figure 1D:
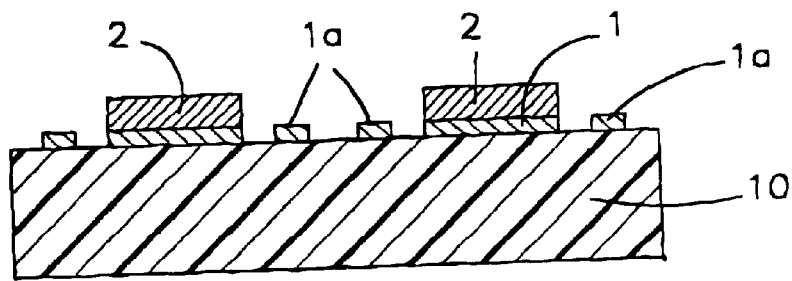

By the above etching technique, a conductor circuit is formed on the surface of a substrate 10 comprising an insulating material as shown in FIG. 1(d). In etching a conductor layer made of copper or the like, palladium deposited on the surface of the insulating material underneath the metal to be removed is itself removed somewhat together with the conductor layer removed by the etching operation. However, part of palladium 1a cannot be removed by the etching operation and remains adsorbed on the resin of the substrate 10.

In accordance with the present invention, the surface of the substrate, after etching as shown in FIG. 1(d), is subjected to an oxidation treatment. The oxidation treatment includes a peranganate treatment, plasma treatment, ozone treatment, and the like. By oxidation treatment, the surface other than that covered with the photoresist layer 3 of the substrate 10 is removed and simultaneously palladium 1a remaining on the surface of the substrate 10 is also removed. This fabrication method is effective for the treatment to a substrate of, e.g., multilayer wiring printed circuit board.

Figure 1E:
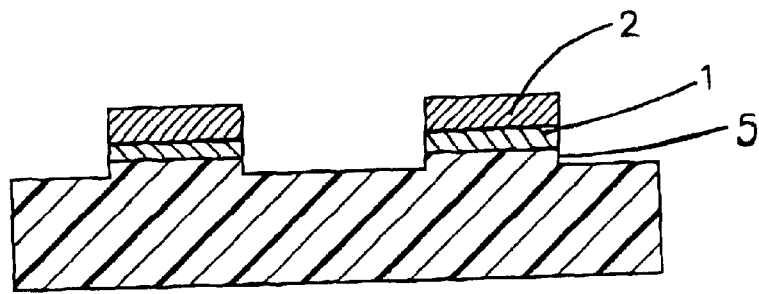

Referring specifically to FIG. 1(e), the adsorbed resin surface of palladium remaining on the substrate (circuit board) on which a circuit is formed is oxidation treated. As mentioned above, permanganate treatment, plasma treatment, ozone treatment, or the like can be used as a means for oxidation treatment. From the standpoint of palladium removal efficiency, permanganate treatment and plasma treatment are preferable.

In the permanganate treatment according to the present invention, it is desirable to soak a circuit board in a swelling agent prior to treatment with permanganate. A swelling agent swells the surface of an insulating material, which swelling effect is effective for the removal of a resin surface layer portion in the following oxidation treatment. As the swelling agent, a reagent composed of, e.g., diethylene glycol-n-butyl ether, anionic surfactant and sodium hydroxide is preferably used. In soaking the circuit board in the swelling agent, the swelling agent is warmed to 60 to 80° C. and the soaking time is preferably 3 to 10 min. More preferably, the substrate is soaked at 75 to 80° C. for about 7 min. After soaking in the swelling agent, the circuit board is washed in water and thereafter the permanganate treatment is performed. In the permanganate treatment, a resin etching solution composed of, e.g., potassium permanganate, sodium hydroxide, and sodium persulfate, is used. The circuit board is soaked in the permanganate solution warmed to 65 to 85° C., preferably at 70 to 85° C., for 3 to 15 min., preferably for about 10 min. Thereafter, the circuit board is washed with water, then soaked for 5 to 7 min. in a neutralizer heated to 43 to 51° C. for neutralization, and further washed in water.

Another oxidation treatment for circuit boards that is effective in accordance with the invention is plasma treatment. In this case, the circuit board is kept in the interior of an enclosed vessel at a vacuum of 0.1 to 10 Torr, preferably 0.1 to 0.5 Torr. Under these conditions, the surface of the circuit board is oxidized by flowing a mixed gas of oxygen and freon gases in this vessel. The mixing rate of freon gas in the mixed gas is 0 to 50%, preferably 3 to 20%, and the flow rate of the mixed gas into the vessel is 0.3 to 21/min, while the treating time is 1 to 15 min, preferably 3 to 7 min. Furthermore, as still another oxidation treatment, treatment with ozone may be used.

By such oxidation treatment, the resin on the surface where the palladium is adsorbed is oxidized and the carbon-containing components therein are converted into $CO_2$. Thus, palladium adsorbed on the resin surface is also removed simultaneously with the removal of the oxidized resin surface. FIG. 1(e) shows a section of a circuit board after oxidation treatment. The portion of the resin surface of substrate 10 other than that carrying the conductor circuit is removed by the oxidation treatment. As a result, these portions of the surface of substrate 10 form stepped parts 5 different in vertical dimension than the insulating portions of substrate not carrying a metal layer.

In the above embodiment, copper is especially useful as the metal element forming conductor layer 2. However, a metal element other than copper can be used for forming conductor layer 2. Moreover, although palladium has been shown as an example of a metal element having a catalytic action for forming conductor layer 2 from copper, a metal element other than palladium having catalytic action to the metal element constituting the conductor layer can be used. However, the catalytic metal element, such as palladium, used in forming the conductor layer needs to be more noble than the metal element constituting the conductor layer in the etching solution for etching the conductor layer.

Thus, as is clear from FIG. 1(e), a circuit board obtained by the inventive fabrication method has a conductor circuit extending horizontally along the surface of an insulating material substrate 10 and this conductor circuit comprises a conductor layer 2, an adsorbed insulating material layer of a catalytic metal element, such as palladium 1 (this insulating material layer is integrated with the substrate 10 comprising an insulating material), and a not adsorbed insulating material layer of a catalytic metal element, such as palladium 1 (the insulating material layer whose surface is removed by oxidation treatment).

WORKING EXAMPLES

In order to more thoroughly illustrate the present invention, the following working examples are presented.

COMPARATIVE EXAMPLE

A substrate, having a circuit formed by etching a plated copper on the whole outermost surface thereof with cupric chloride was soaked in an electroless copper plating solution (Cuposit 252: Siplay Far East Co., Ltd.) for 24 hr.

Embodiment 1

A substrate having a circuit formed thereon by etching a plated copper layer on the whole outermost surface thereof with cupric chloride was treated with a swelling agent (Circuposit MLB conditioner 211: Siplay Far East Co., Ltd.) warmed at 70° C. for 5 min and washed with water. Next the device was soaked in a resin etching solution (potassium permanganate solution, Circuposit MLB promoter 213, Siplay Far East Co., Ltd.) and then warmed at 75° C. for 8 min. After sufficient washing in water, the substrate was soaked in a neutralizer (sulfuric acid, Circuposit MLB neutralizer 216, Siplay Far East Co., Ltd.) warmed at 45° C. for 6 min and then sufficiently washed in water. After completion of this treatment, the substrate was soaked in electroless copper plating solution (Cuposit 252, Siplay Far East Co., Ltd.) for 24 hr.

Embodiment 2

A substrate, having a circuit formed thereon by etching a plated copper layer on the whole outermost surface thereof with cupric chloride, was treated for 5 min by flowing a mixed gas with a ratio of oxygen to freon of 9:1 at the rate of 1.5 1/min under a reduced pressure of 0.2 Torr. After the completion of this treatment, the substrate was soaked in an electroless copper plating solution (Cuposit 252, Siplay Far East Co., Ltd.) for 24 hr. The state of the substrate surface after electroless copper plating treatment was observed for the above Control and Embodiments 1 and 2.

Surface observation after electroless copper plating treatment

Comparative Example: Copper was etched and copper was deposited on the surface of the epoxy resin in exposed areas between segments of the circuit.

Embodiment 1: The surface of the epoxy resin between segments of the circuit is identical to a state before electroless copper plating and no deposit of copper was observed.

Embodiment 2: The surface of the epoxy resin between segments of the copper circuit is identical to a state before electroless copper plating and no deposit of copper was observed.

The above surface observation reveals that when a substrate having a conductor circuit formed thereon by etching is subject to a permanganate treatment (Embodiment 1) or a plasma treatment (Embodiment 2), copper is not deposited even if the device is subjected to electroless copperplating again. This indicates that palladium does not remain on the surface of the epoxy resin in the insulating layers (between segments of the conductor) during the second electroless copper plating and hence copper is not deposited by catalytic action of the palladium. In the case of the comparative Example, copper is deposited by catalytic action of this palladium because palladium remains on the surface of epoxy resin in insulating layers (between segments of the conductor).

As concluded from above, by removing a metal, such as palladium, remaining in etching at the fabrication of a circuit board, such as multilayer wiring printed circuit boards, and acting as catalyst during the formation of a conductor layer, the present invention can prevent the generation of a short circuit attributable to the deposit of a metal under catalytic action of this palladium or the like.

What we claim is:

1. A circuit board comprising an insulating substrate having a first major surface, said first major surface defining conductor-carrying regions and insulating regions therebetween, said conductor-carrying regions carrying respective conductors made from a first metal, a second metal being arranged between said conductors and said first major surface in said conductor-carrying regions, said second metal being adhered to said first major surface in said conductor-carrying regions by adsorption, said second metal promoting deposition of said first metal on said conductor-carrying regions by electroless deposition, the insulating regions of said first major surface being free of said second metal, said first major surface in said insulating regions beings arranged vertically below said first major surface in said conductor-carrying regions whereby said conductor-carrying regions form stepped substrate sections.

2. The circuit board of claim 1, wherein said second metal is more noble than said first metal.

3. The circuit board of claim 2 wherein said second metal is palladium.

* * * * *